United States Patent [19]

Yamanaka

[11] Patent Number: 5,255,278
[45] Date of Patent: Oct. 19, 1993

[54] SEMICONDUCTOR LASER WITH VERTICAL RESONATOR
[75] Inventor: Yutaka Yamanaka, Tokyo, Japan
[73] Assignee: Nec Corporation, Tokyo, Japan
[21] Appl. No.: 911,577
[22] Filed: Jul. 10, 1992
[30] Foreign Application Priority Data
Jul. 10, 1991 [JP] Japan .................. 3-168543
[51] Int. Cl.⁵ .................................. H01S 3/19
[52] U.S. Cl. ............................. 372/45; 372/27; 372/96; 372/99; 372/102
[58] Field of Search ............. 372/45, 96, 99, 102, 372/27

[56] References Cited
U.S. PATENT DOCUMENTS

| | | | |
|---|---|---|---|
| 4,964,134 | 10/1990 | Westbrook et al. | 372/45 |
| 5,020,072 | 5/1991 | Abe et al. | 372/96 |
| 5,088,099 | 2/1992 | Chen et al. | 372/45 |
| 5,170,407 | 12/1992 | Schubert et al. | 372/96 |

FOREIGN PATENT DOCUMENTS 0053485  3/1989  Japan .................. 372/45

Primary Examiner—Georgia Y. Epps
Attorney, Agent, or Firm—Sughrue, Mion, Zinn, Macpeak & Seas

[57] ABSTRACT

The invention relates to a semiconductor laser with a resonator constructed on and vertical to a substrate surface. The vertical resonator has a first reflector mirror which is a multilayer laminate mirror formed on the substrate surface, an active region on the first mirror and a second reflector mirror region including a multilayer laminate mirror on the active region and a metal layer at the top. The second mirror region is provided with a phase grating layer which is adjacent to and in contact with the metal layer and has a periodical structure in a direction in a transversal plane with a period not longer than the laser oscillation wavelength. For example, the grating layer is a relief layer having parallel grooves in the upper surface, and the grooves are filled up with a bottom part of the metal layer. The grating layer differentiates the reflectance of the second reflector mirror region depending on the direction of polarization of incident light. Therefore it is possible to emit laser light polarized in a specific direction.

8 Claims, 2 Drawing Sheets

SEMICONDUCTOR LASER WITH VERTICAL RESONATOR

BACKGROUND OF THE INVENTION

This invention relates to a semiconductor laser having a resonator constructed on and vertical to a substrate surface.

In conventional semiconductor lasers a resonator is constructed in a plane parallel to a substrate surface. With the development of crystal growing techniques recently it has become possible to construct a resonator structure on a substrate surface in the direction vertical to the substrate surface. Herein such a resonator will be called a vertical resonator.

A known vertical resonator has a first reflector mirror on the surface of a substrate, an active layer on the first mirror and a second reflector mirror on the active region. For example, on a GaAs substrate the first mirror is a reflective multilayer laminate formed of alternately arranged GaAs layers and AlAs layers. The active region has quantum wells of InGaAs sandwiched between two AlGaAs layers. The second mirror includes a reflective multilayer laminate formed of alternately arranged GaAs layers and AlAs layers, a metal electrode layer at the top and a spacing layer of GaAs which interposes between the reflective multilayer laminate and the metal electrode layer. In each mirror the reflective multilayer laminate consists of quarter-wave layers, and the total number of layers is about 10 to 20. The first mirror is doped into n-type and the second mirror into p-type. After forming all the layers for the resonator the layers of the second mirror and the active region are mesa etched to thereby obtain a vertical resonator structure in which transverse mode of oscillation is confined With this vertical resonator the oscillation wavelength is about 950 nm, and laser light is emitted toward the substrate.

In a semiconductor laser with the above described vertical resonator the material of every layer is isotropic, and there is no anisotropy in any transversal plane of the vertical resonator. Therefore, the direction of polarization of the emitted laser light is indefinite, and for this reason the application of the semicondutor lasers of this type to optical devices or systems is restricted.

SUMMARY OF THE INVENTION

It is an object of the present invention to provide a semiconductor laser with a vertical resonator which can emit light polarized in a specific direction.

In a semiconductor laser according to the invention the vertical resonator has a first reflector mirror which is a multilayer laminate mirror formed on the surface of a semiconductor substrate, an active region formed on the first mirror and a second reflector mirror c region having a multilayer laminate mirror formed on the active region, and according to the invention the above object is accomplished by incorporating a phase grating layer into the second reflector mirror region. More definitely, in a direction parallel to a transversal plane the phase grating layer has a periodical structure with a period not longer than the laser oscillation wavelength, and the grating layer is adjacent to and in contact with a metal layer which is at the top of the vertical resonator.

The grating layer according to the invention has the function of differentiating the reflectance of the second mirror region depending on whether incident light is polarized in the direction parallel to the direction of the periodical structure of the grating or in the direction perpendicular to the direction of the periodical structure. Therefore, with the vertical resonator including the grating layer it is possible to make laser oscillation in a specific direction of polarization.

A preferred embodiment of the grating layer according to the invention is a relief layer formed with parallel grooves which are filled up with the bottom of the overlying metal layer. Another preferred embodiment of the grating layer is an alternate arrangement of two kinds of stripes different in refractivity.

DESCRIPTION OF THE PREFERRED EMBODIMENTS

Figure 1:
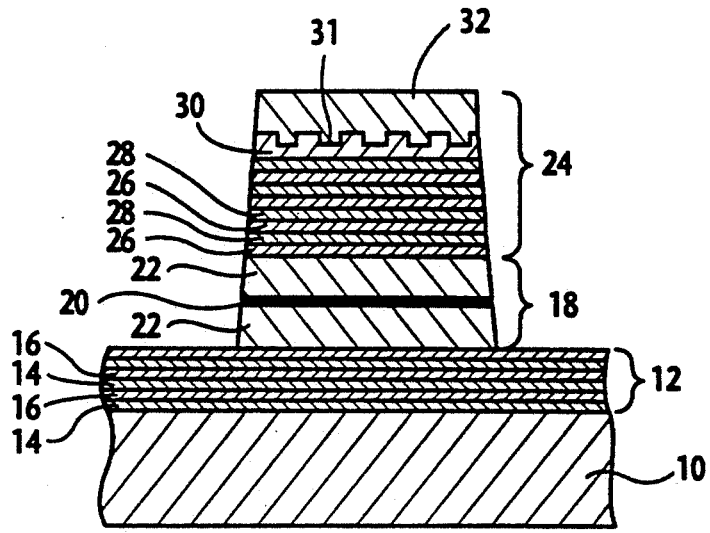
FIG. 1 is an explanatory, vertical sectional view of a semiconductor laser with a vertical resonator which is an embodiment of the invention.

As a first embodiment of the invention FIG. 1 shows a semiconductor laser having a vertical resonator structure constructed on a GaAs substrate 10. On the substrate surface a first reflector mirror region 12 is provided by alternately laminating a number of AlAs films 14 and a number of GaAs films 16. The first mirror 12 is doped into n-type. On the first mirror 12 there is an active region 18 having InGaAs quantum wells 20 sandwiched between two undoped AlGaAs layers 22. A second reflector mirror region 24 is provided by alternately laminating a number of GaAs films 26 and a number of AlAs films 28 on the active region 18, then forming a grating layer 30 of a relief structure having parallel grooves 31 on the multilayer laminate mirror (26,28) and covering the grating layer 30 with a metal electrode layer 32, e.g. Au layer, such that the metal fills up the grooves 31 in the upper surface of the grating layer 30. The grating layer 30 has a regularly periodical structure in a specific direction in a transversal plane, and the period of the periodical structure is nearly equal to or shorter than the wavelength of the oscillated laser light. In this embodiment the periodical structure is the parallel arrangement of the grooves 31 at regular intervals. The semiconductors in the second mirror 24 are doped into p-type. A vertical resonator structure in which transverse mode of oscillation is confined is obtained by mesa etching of the active region 18 and the second mirror region 24. Alternatively the confinement of transverse mode is achieved by selective diffusion of a suitable impurity such as Zn so as to differentiate refractivity. In each of the first and second mirrors 12 and 24 the AlAs/GaAs multilayer laminate mirror consists of quarter-wave films, and the reflectance of each mirror becomes more than 90% by laminating 10 to 20 films. In the second mirror 24 it is possible to count in the reflection by the metal electrode layer 32.

With the above described vertical resonator in FIG. 1 the oscillation wavelength is about 950 nm, and laser light is emitted in the vertical direction toward the substrate 10.

Figure 5:
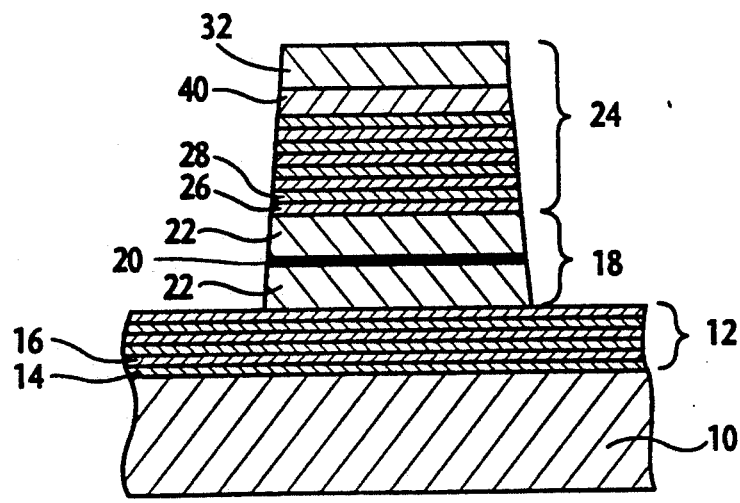
FIG. 5 is an explanatory, vertical sectional view of a known semiconductor laser with a vertical resonator.

For comparison, FIG. 5 shows a semiconductor laser with a known vertical resonator structure. In this semiconductor laser the first mirror 12 and the active region 18 do not differ from the counterparts in FIG. 1. The second mirror region 24 in FIG. 5 has a multilayer laminate formed of alternate arrangement of GaAs films 26 and AlAs films 28 at the bottom and a metal electrode layer 32 at the top, and a simple spacing layer 40 of GaAs is interposed between the multilayer laminate and the metal electrode layer. Thus, in the vertical resonator in FIG. 5 there is no anisotropy in any transversal plane.

Figure 2:
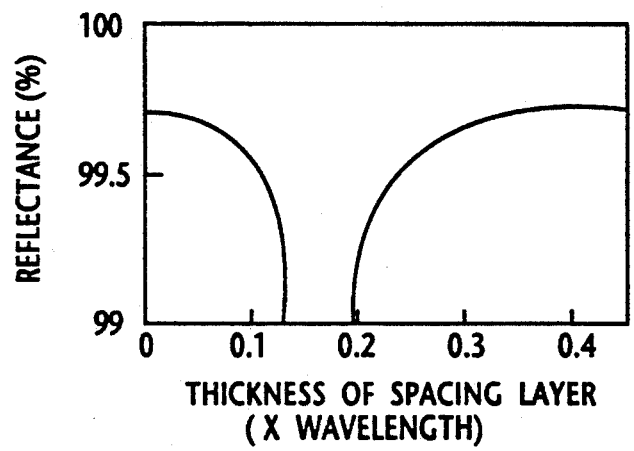
FIG. 2 is a graph for explanation of the effect of the thickness of a spacing layer in a mirror region of a vertical resonator of a semiconductor laser.

The reflectance of the second mirror region 24 depends on the thickness of the spacing layer 40 (by comparison with the oscillation wavelength) in the manner as shown in FIG. 2. Therefore, the thickness of the spacing layer 40 is adjusted to 0.3-0.4 of the oscillation wavelength in order to realize high reflectance of the second mirror region 24.

Figure 3:
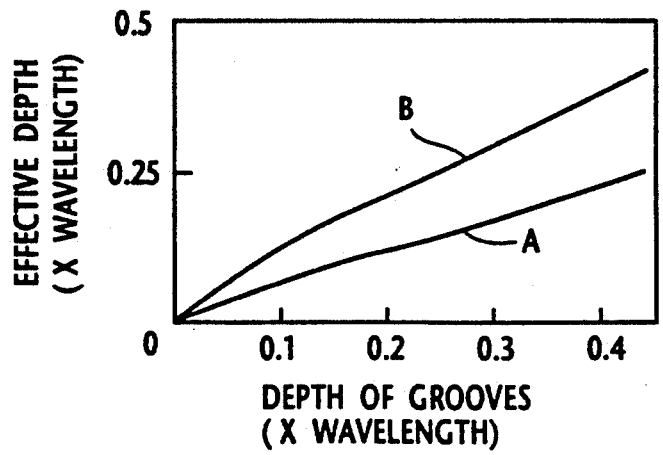
FIG. 3 is a graph for explanation of the function of a grating layer in a vertical resonator according to the invention with respect to the direction of polarization of incident light.

In the grating layer 30 according to the invention the grooves 31 of the grating have a constant depth. However, on condition that the period of the grating is equivalent to or shorter than the oscillation wavelength, the depth of the grooves 31 seems to differ with the directions of polarization of incident light. FIG. 3 illustrates this phenomenon. That is, FIG. 3 shows the relationship between the actual depth of the grooves 3 and an effective depth of the grooves for polarized light that is incident on the grating. In FIG. 3 the curve A represents polarization of incident light in the direction parallel to the grooves 31 and the curve B polarization in the direction perpendicular to the grooves. Thus, an effective depth of the grooves 31 becomes relatively shallow for incidence of light polarized parallel to the grooves and relatively deep for incidence of light polarized perpendicular to the grooves. This is equivalent to a change in an effective thickness of a spacing layer between the AlAs/GaAs multilayer laminate (26, 28) and the metal electrode layer 32, and hence the reflectance of the second mirror region 24 differs with the directions of polarization of incident light. In a laser resonator oscillation occurs predominantly with specific polarization of light that reduces the resonator loss, i.e. with specific polarization of light that enhances the reflectance of the mirrors of the resonator. Therefore, by the provision of the grating layer 30 in the vertical resonator it becomes possible to control the direction of polarization of light for oscillation and emitted laser light.

Figure 4:
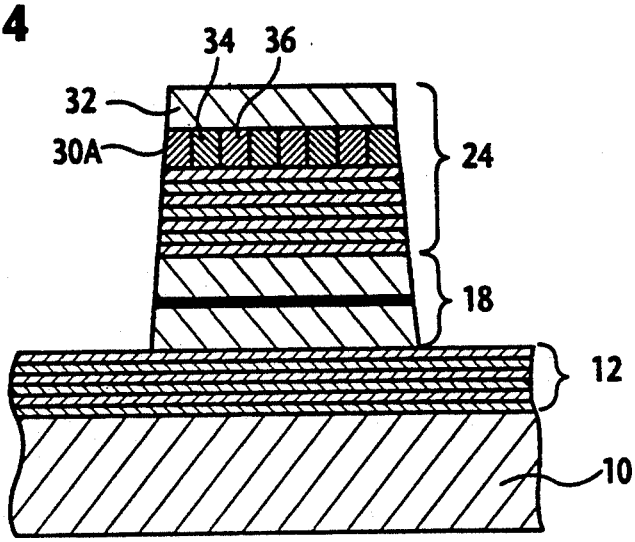
FIG. 4 is an explanatory, vertical sectional view of a semiconductor laser with a vertical resonator which is another embodiment of the invention.

FIG. 4 shows another embodiment of the invention, which is similar to the embodiment shown in FIG. 1 except the construction of the grating layer. In the device of FIG. 4 the grating layer 30A is formed by alternately arranging first parallel stripes 34 of a first material and second parallel stripes 36 of a second material which differs in refractivity from the first material. For example, AlAs and GaAs can be employed as the first and second materials. In this case transmissive refractivity of the grating layer 30A differs with directions of polarization of incident light, and hence the reflectance of the second mirror region 24 differs with directions of polarization.

Also it is possible to construct a grating layer equivalent to the grating layer 30A in FIG. 4 by first forming a uniform layer of a semiconductor material and then varying the refractivity of that layer in predetermined stripe-like regions by diffusion of a suitable impurity such as Zn.

What is claimed is:

1. A semiconductor laser device comprising a semiconductor substrate and a vertical resonator constructed on the substrate, the vertical resonator comprising:

a first reflector mirror region which comprises a multilayer laminate mirror formed on a surface of said substrate;

an active layer which comprises a double heterojunction and is formed on said first reflector mirror region; and a second reflector mirror region comprising a multilayer laminate mirror formed on said active region, a phase grating layer which has a periodical structure in a plane parallel to a transversal plane with a period not longer than the laser oscillation wavelength and a metal layer which is formed on and in contact with said grating layer.

2. A semiconductor laser device according to claim 1, wherein said grating layer is a relief layer having a plurality of parallel grooves in the upper surface, said grooves being filled up with a bottom part of said metal layer.

3. A semiconductor laser device according to claim 2, wherein said grating layer is a GaAs layer.

4. A semiconductor laser device according to claim 1, wherein said grating layer is formed of an alternate arrangement of a plurality of first parallel stripes of a first material and a plurality of second parallel stripes of a second material which differs in refractivity from said first material.

5. A semiconductor laser device according to claim 4, wherein said first and second materials are AlAs and GaAs, respectively.

6. A semiconductor laser device according to claim 1, wherein the multilayer laminate mirror of each of said first and second reflector mirror regions is an alternate arrangement of a plurality of GaAs layers and a plurality of AlAs layers.

7. A semiconductor laser device according to claim 6, wherein each of said GaAs layers and said AlAs layers has a thickness equivalent to a quarter of the laser oscillation wavelength.

8. A semiconductor laser device according to claim 1, wherein said active region comprises quantum wells of InGaAs sandwiched between two AlGaAs layers.

* * * * *